(12) United States Patent
Pan et al.

(10) Patent No.: US 8,004,917 B2
(45) Date of Patent: Aug. 23, 2011

(54) BANDGAP VOLTAGE AND TEMPERATURE COEFFICIENT TRIMMING ALGORITHM

(75) Inventors: Feng Pan, Fremont, CA (US); Yuxin Wang, Sunnyvale, CA (US); Jonathan H. Huynh, San Jose, CA (US); Albert Chang, Santa Clara, CA (US); Khin Htoo, Sunnyvale, CA (US); Qui Vi Nguyen, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 303 days.

(21) Appl. No.: 12/235,467

(22) Filed: Sep. 22, 2008

(65) Prior Publication Data

US 2010/0074033 A1    Mar. 25, 2010

(51) Int. Cl.
*G11C 7/04* (2006.01)

(52) U.S. Cl. .................... 365/211; 365/212; 365/214

(58) Field of Classification Search .................. 365/211, 365/212, 214
See application file for complete search history.

(56) References Cited

U.S. PATENT DOCUMENTS

| | | | |
|---|---|---|---|
| 6,560,152 B1 | 5/2003 | Cernea | |
| 6,735,546 B2 | 5/2004 | Scheuerlein | |
| 6,801,454 B2 | 10/2004 | Wang et al. | |
| 6,839,281 B2 | 1/2005 | Chen et al. | |
| 6,954,394 B2 | 10/2005 | Knall et al. | |
| 6,956,516 B2 * | 10/2005 | Furuichi | 341/155 |
| 7,057,958 B2 | 6/2006 | So et al. | |
| 7,236,023 B2 | 6/2007 | Thorp et al. | |
| 7,269,092 B1 | 9/2007 | Miwa | |
| 7,277,343 B1 | 10/2007 | So et al. | |
| 7,283,414 B1 | 10/2007 | So et al. | |
| 7,342,831 B2 | 3/2008 | Mokhlesi et al. | |
| 7,391,650 B2 | 6/2008 | Mokhlesi et al. | |
| 7,554,869 B2 * | 6/2009 | Kim et al. | 365/211 |
| 7,646,659 B2 * | 1/2010 | Sako | 365/212 |
| 2007/0286004 A1 * | 12/2007 | Kim et al. | 365/212 |
| 2008/0031066 A1 | 2/2008 | Nandi | |
| 2008/0094908 A1 | 4/2008 | Mokhlesi et al. | |
| 2008/0094930 A1 | 4/2008 | Mokhlesi | |
| 2008/0158947 A1 | 7/2008 | Li et al. | |
| 2008/0158970 A1 | 7/2008 | Sekar et al. | |
| 2008/0158975 A1 | 7/2008 | Sekar et al. | |
| 2008/0159000 A1 | 7/2008 | Li et al. | |
| 2008/0238530 A1 * | 10/2008 | Ito et al. | 327/513 |

* cited by examiner

*Primary Examiner* — Anh Phung
*Assistant Examiner* — Hien Nguyen
(74) *Attorney, Agent, or Firm* — Davis Wright Tremaine LLP

(57) ABSTRACT

A circuit and corresponding method for providing a reference voltage are presented. The circuit includes a current source having a magnitude with positive temperature correlation connected to a node, and a diode element connected between the node and ground, where the node supplies the reference voltage. The circuit also includes a variable resistance connected to receive an input indicative of the circuit temperature and through which the diode element is connected to the node. The value of the variable resistance is adjusted based upon the circuit temperature input. The circuit is useful for application as a peripheral circuitry, such as on a flash or other non-volatile memory and other circuits requiring an on-chip reference voltage source.

15 Claims, 4 Drawing Sheets

BANDGAP VOLTAGE AND TEMPERATURE COEFFICIENT TRIMMING ALGORITHM

FIELD OF THE INVENTION

This invention pertains generally to the field of bandgap voltage reference circuit and, more particularly, to bandgap circuits incorporating voltage trimming.

BACKGROUND

There is often a need in integrated circuits to have a reliable source for a reference voltage. One widely used voltage reference circuit is the bandgap voltage reference. The bandgap voltage reference is generated by the combination of a Proportional To Absolute Temperature (PTAT) element and a Complementary To Absolute Temperature (CTAT) element. The voltage difference between two diodes is used to generate a PTAT current in a first resistor. The PTAT current typically is used to generate a voltage in a second resistor, which is then added to the voltage of one of the diodes. The voltage across a diode operated with the PTAT current is the CTAT element that decreases with increasing temperature. If the ratio between the first and second resistor is chosen properly, the first order effects of the temperature can be largely cancelled out, providing a more or less constant voltage of about 1.2-1.3 V, depending on the particular technology.

Since bandgap circuits are often used to provide an accurate, temperature independent reference voltage, it is important to minimize the voltage and temperature related variations over the likely temperature range over which the bandgap circuit will be operated. One usage of bandgap circuits is as a peripheral element on non-volatile memory circuits, such as flash memories, to provide the base value from which the various operating voltages used on the circuit are derived. There are various ways to make bandgap circuits less prone to temperature dependent variations; however, this is typically made more process limited, and is difficult in applications where the bandgap circuit is a peripheral element, since it will share the same substrate and power supply with the rest of the circuit and will often be allowed only a relatively small amount of the total device's area.

SUMMARY OF THE INVENTION

A circuit and corresponding method for providing a reference voltage are presented. The circuit includes a current source having a magnitude with positive temperature correlation connected to a node, and a diode element connected between the node and ground, where the reference voltage is provided from the node. The circuit also includes a variable resistance connected to receive an input indicative of the circuit temperature and through which the diode element is connected to the node. The value of the variable resistance is adjusted based upon the circuit temperature input.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

The various aspects and features of the present invention may be better understood by examining the following figures, in which.

DETAILED DESCRIPTION

Figure 1:
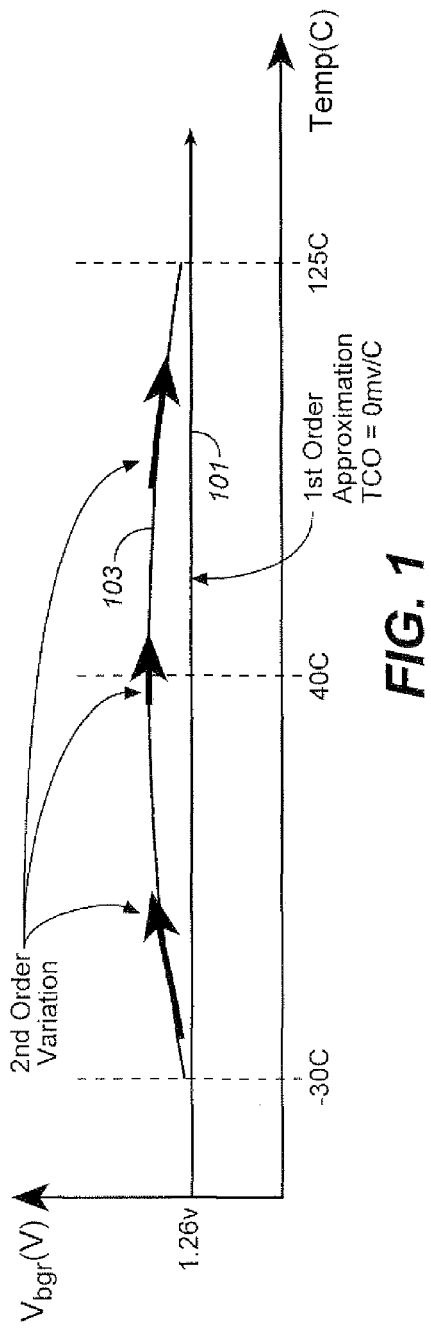
FIG. 1 illustrates the ideal bandgap voltage behavior with respect to temperature.

The techniques presented here can be employed to overcome some of the limitations of the prior art. FIG. 1 shows the temperature dependence of an "ideal" bandgap reference circuit, where it is ideal in that the bandgap voltage, Vbgr, has no first order variation over the desired temperature range, although there is typically a second order variation for most implementations. As shown in FIG. 1, the temperature range of interest for the example is taken as −30C to 125C, which is a fairly standard range for an integrated circuit. Over this range, the first order of variation of Vbgr with respect to temperature, Vbgr (T), is zero:

$$\frac{\partial Vbgr}{\partial T} = 0 \text{ mv/C}$$

This is shown by the flat line 101 at the ideal value of 1.26 volts with a temperature variation coefficient of Tco=0 mv/C. The second order variation of Vbgr(T) over T will typically be of the non-linear form shown at 103.

Figure 2:
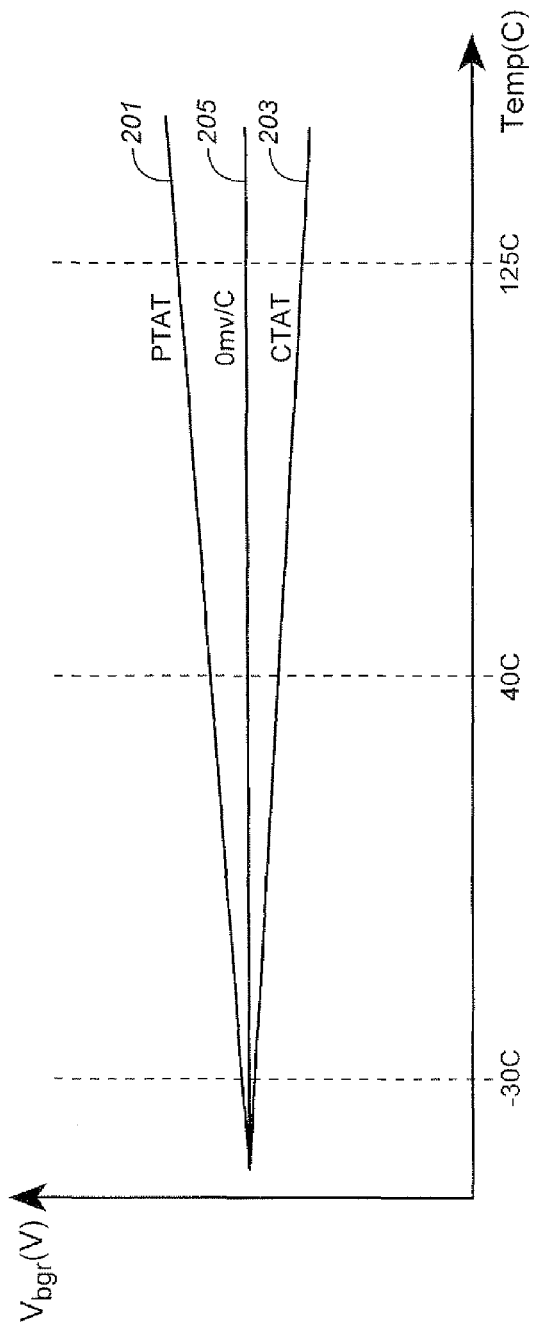
FIG. 2 shows the behavior of the PTAT and CTAT elements.

In a realistic bandgap circuit, the voltage Tco varies due to many factors. These can include process variations, device mismatches, op-amp offset, and limited gain of op-amp. As discussed in the Background, a bandgap referenced value can be formed by the combination of a PTAT element and a CTAT element, with respective the sort of behavior shown in FIG. 2 at 201 and 203. The resultant combination is shown at 205 for the ideal case. The factors noted can affect the PTAT element, CTAT element, or how they are combined and lead non-ideal Tco in the first order temperature dependence of the realistic bandgap voltage.

Figure 3:
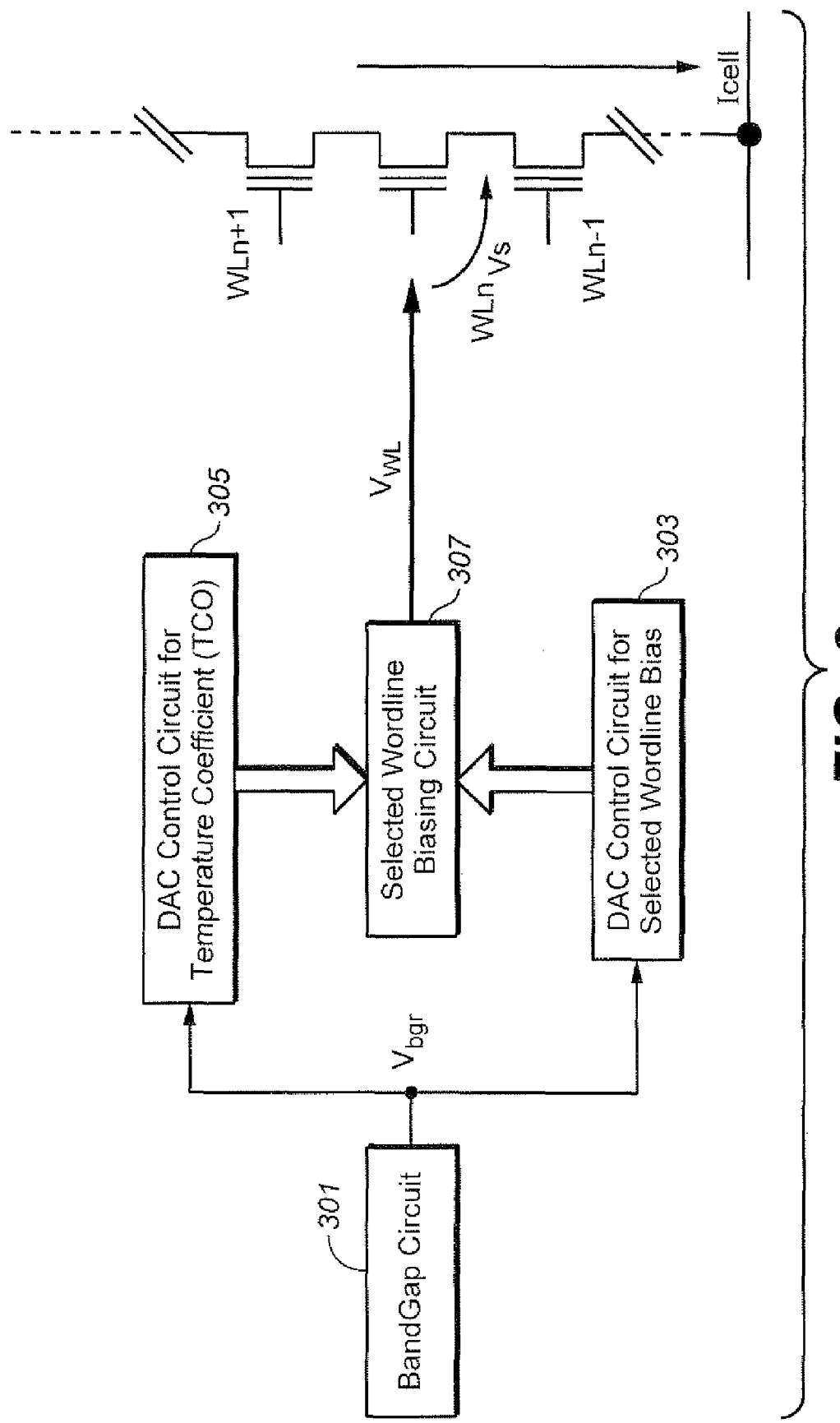
FIG. 3 shows an application of a bandgap reference circuit to supply a bias circuit.

One use of a bandgap circuit is as a peripheral element on a circuit, such as on a memory chip for providing a reference voltage from which various operating voltages can be generated. FIG. 3 is a block diagram of an example of this, where the bandgap circuit 301 supplies the reference voltage Vbgr to a control circuit 303 so that it can generate, in the example, the wordline bias voltage $V_{WL}$ for reading a (in this case) floating gate memory cell in a NAND type architecture. This application of a bandgap circuit is described further in "On-Chip Bias Voltage Temperature Coefficient Self-Calibration Mechanism", by Yuxin Wang, Feng Pan, Byungki Woo, Trung Pham and Khin Htoo, filed on the same day as the present application. Briefly, in the arrangement of FIG. 3, the control circuit 303 generates a temperature independent wordline read voltage (Vcgrv) for the various data states of the memory cell from Vbgr. In FIG. 3, Vbgr is also supplied to a second control circuit 305, which generates a component for $V_{WL}$ having a temperature coefficient Tco to track the temperature dependent behavior of the memory cells. The biasing circuitry 307 then combines the state dependent contribution from 303 with the temperature dependent contribution from 305 to obtain $V_{WL}$ to supply the selected wordline WLn of an NAND string of EEPROM cells. (Here the temperature dependent coefficient generated in 305 for the wordline voltage needs to be distinguished from the any temperature dependency arising in the bandgap circuit 301. Aside from this discussion of an application of a bandgap circuit, the main concern of the present invention is the temperature dependence of Vbgr.) If Vbgr is the bandgap reference voltage and V'(T) is a voltage with a linear positive temperature correlation, this gives a control gate reference voltage level of:

$$Vcgrv = m*Vbgr - n*V'(T)$$

where m is a fixed coefficient for a given threshold state and n is fixed coefficient to generate the desired temperature coefficient, such as –2 mv/C.

More detail and examples related to temperature related operation, mainly in the context of memory devices, and uses where bandgap reference values can be used to generate operating voltages can be found in the following U.S. patents, publications, and applications: U.S. Pat. Nos. 6,735,546; 6,954,394; 7,057,958; 7,236,023; 7,283,414; 7,277,343; 6,560,152; 6,839,281; 6,801,454; 7,269,092; 7,391,650; 7,342,831; 2008/0031066A1; 2008/0159000A1; 2008/0158947A1; 2008/0158970A1; 2008/0158975A1; Ser. Nos. 11/772,103; 11/772,097; 11/958,524; 11/958,534; 11/772,015; and 11/772,018. Along with these temperature related aspects, the generation of various operating voltages from reference values is presented in U.S. Pat. No. 5,532,962. The techniques presented here can be applied for the various base reference voltages described in these references as well as other applications where bandgap circuits are employed, but being particularly advantageous when used as a peripheral element on a larger circuit where the design, process, technology, and/or product limitations of the larger circuit can negatively affect the bandgap reference element. In addition to the main example described here of a non-volatile memory, these technique also have application where high voltage biases are needed, such as when a bandgap voltage is used as the reference voltage for charge pump regulation and the high voltage output from the charge pump is generated by multiplying of the bandgap voltage. Various process and device limitations require an accurate voltage level be provided without too much variation so as to prevent oxide/junction break downs or punch through effect on the devices. In this application, any temperature variation of the bandgap voltage would be multiplied in forming the high voltage biases. Consequently, the minimizing the temperature variation of the bandgap voltage is important for this type of application as well.

The formula for Vcgrv is based on a few assumptions. A first of these is that Vbgr is temperature independent. Another is that the Vptat is term has the assumed positive temperature dependence. There are also assumptions on the coefficients: that in will increase as read/verify changed from the lowest state to the highest state, for example; and that n is fixed value, multiplying Vptat to give the desired (here –2 mv/C) temperature coefficient.

These assumptions may not be met by an actual device when fabricated. The actual output of the bandgap circuit, Vbgr, could have a positive to temperature correlation, the desired variation of 0 mv/C, or a negative (or complementary) to temperature behavior. As the read/verify level increases for the higher states, m increases. Any temperature variation of Vbgr will be amplified, to causing the resultant Vcgrv to have a large variation due to the bandgap circuit's temperature variation. As this variation is multiplied by m, it will increase with the state dependent m value, instead of part of the state independent n term. To put some numbers to an example, a +/–1 mv/C variation on Vbgr will cause the highest state control gate bias to have +/–100 mv over 100C. Such threshold variations could lead to error in the allotted threshold window that is critical for 3 bits/Cell, 4 bits/Cell designs.

In many applications of bandgap circuits, such as the memory circuit above, the bandgap circuit is a peripheral circuit on a larger device, which makes it difficult to minimize Vbgr variation, as discussed in the Background. In the case of a pure analog device, many of these limitations (shared substrate, shared power supply, layout area limitations) are reduced or absent, which can minimize bandgap voltage variation over temp down to μV range. The techniques here can be used to provide a bandgap circuit that yields a desired bandgap reference voltage, such as the target 1.261V ideal textbook value, even for actual applications including peripheral circuits.

Figure 4:
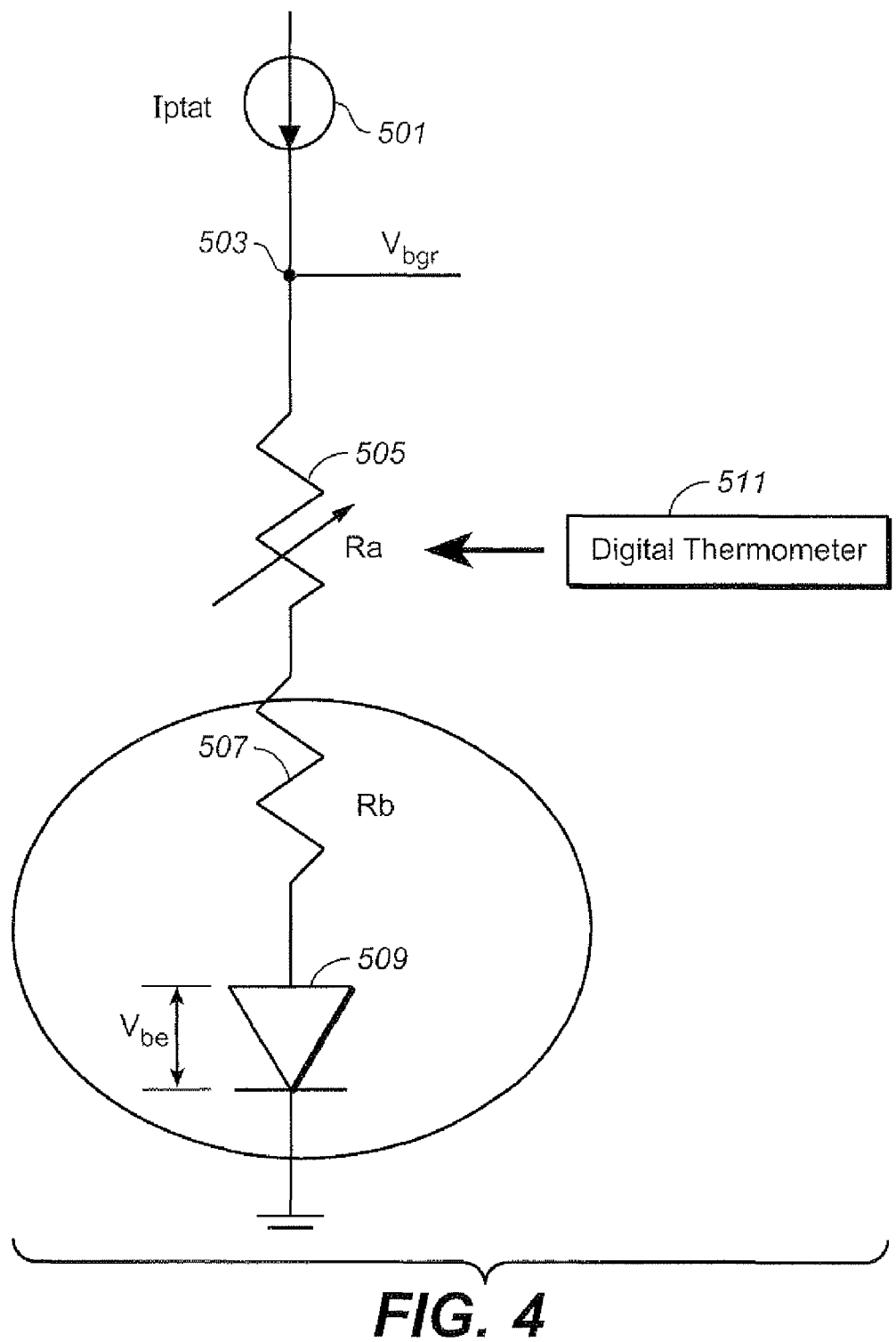
FIG. 4 is a schematic diagram of an exemplary embodiment of a bandgap reference circuit.

FIG. 4 is a schematic diagram of an exemplary embodiment. A PTAT current source 501 provides a current Iptat and is connected in series with a resistance Rb 507 and a diode 509. The bandgap reference voltage Vbgr is then taken at the node 503 and is set above ground by the voltage drop (Iptat*Rb) across Rb 507 and the voltage drop Vbe across the diode 509. These elements described so far are fairly typical of existing bandgap designs. To allow for trimming of the temperature dependence, a variable resistance is added in series with other elements. As shown in FIG. 4, a variable resistance Ra 505 is added in series between the node 503 and Rb 507.

The introduction of the Ra 505 gives a bandgap reference voltage of:

$$Vbgr = Vbe + Iptat*Rb + Iptat*Ra$$

By making the variable resistance vary with temperature, Ra(T), the resistance Ra 505 can be used to counteract any undesirable temperature dependence in the bandgap reference voltage; that is, an intentional temperature dependence can introduced into Ra 505 to offset any undesired temperature dependence in usual combination of PTAT and CTAT elements, thereby helping to minimize any temperature dependence in Vbgr.

The resistance Ra 505 can be controlled by a temperature sensing circuit 511, such as the digital thermometer implementation of FIG. 4. The variable resistance Ra 505 can be implemented as a string of resistors with switches at the inter-resistance nodes, for example, allowing it to be tapped at the desired value. An exemplary embodiment is as an 8 bit digital to analog resistance, with other implementations being possible depending upon the desired degree of fine tuning.

The exemplary embodiment described here uses a linear implementation, where Ra will vary linearly with temperature. Although other functional forms can be similarly implemented to account for second, third or higher order corrections, as most concerns about non-ideal bandgap behavior relate to linear temperature dependence, the linear implementation given here will typically be sufficient to address such concerns. The trimming of the temperature coefficient for the linear case will be described with respect to FIG. 5.

Figure 5:
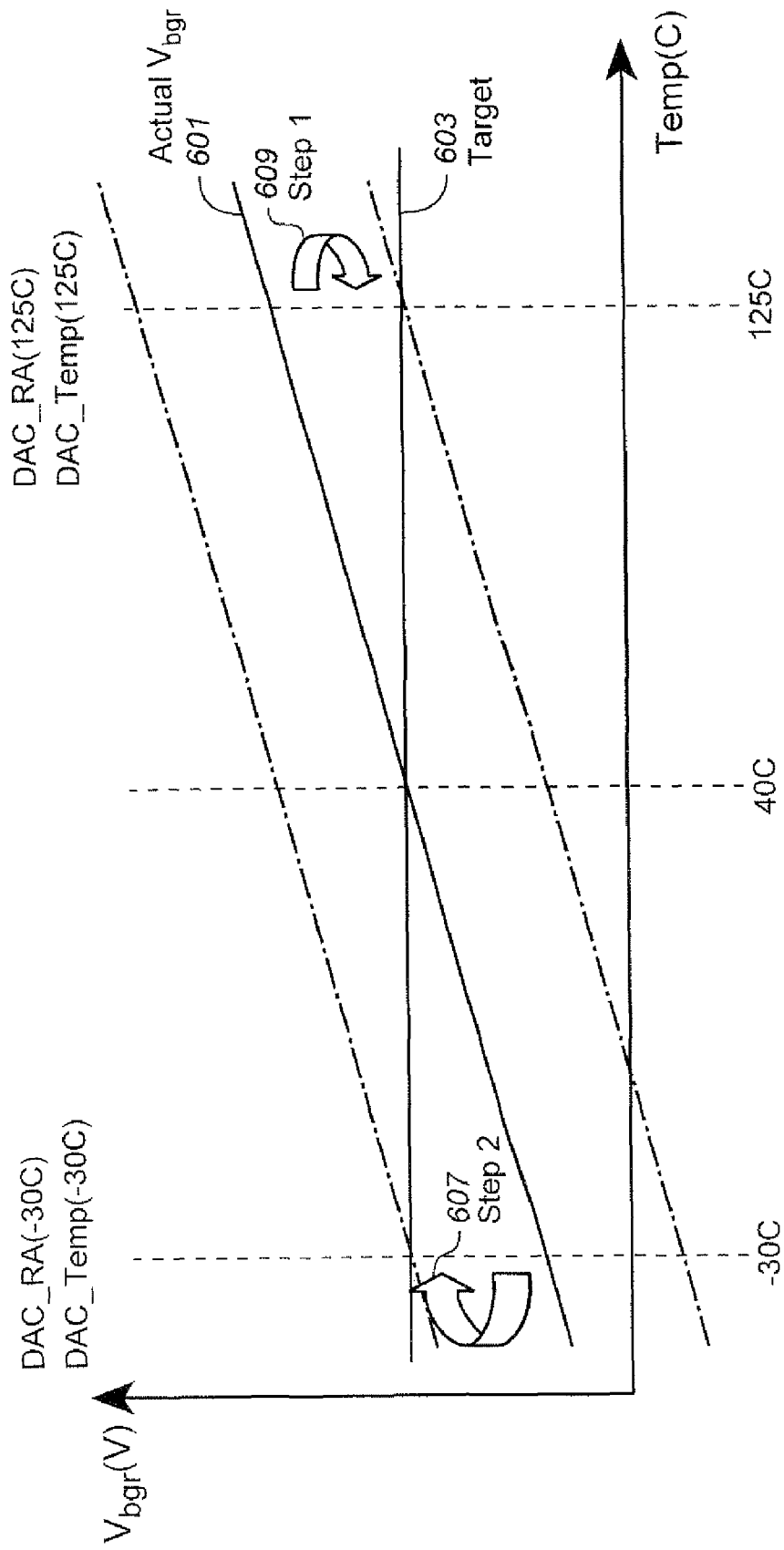
FIG. 5 illustrates a bandgap temperature coefficient trimming algorithm.

FIG. 5 shows the output bandgap reference voltage versus temperature for a range of –30C to 125C, which is taken as a sufficient range to cover the likely extremes of operating conditions of the exemplary use of a peripheral element on a memory circuit. Applications to other ranges follow readily.

In FIG. 5, the target behavior of Vbgr over the range is the flat value of 1.26V (or, more generally, a tester value) shown at 603. The actual behavior is shown at 601. (Here, the actual Vbgr is shown as increasing with T, but in other cases it will have a decreasing, CTAT dependence.) To align these two, at the lower end of the temperature range, the actual Vbgr value needs to move (in this case) up, as shown by the arrow 607, and moved down at the upper end, as shown by the arrow 609. For a linear digital implementation, this can be done by assigning a digital values to the temperatures at the ends of the range, shown on FIG. 5 to DAC_Temp(−30C) and DAC_Temp(125C), and computing the required values for Ra at these temperatures, DAC_RA(−30C) and DAC_RA(125C).

In operation, the temperature sensor, here digital, would sense DAC_Temp(Temp). This could be done before any operation or on some other sort of prescribed basis. An initial trimming operation would also be performed from a tester value or provided from precision measurement equipment and the trimming can be done internally or externally. In a typical process, the trimming could be done after manufacture, but prior to shipping the device. An accurate tester or precision testing equipment can be used to provide generate more accurate reference values for the trimming process. These more accurate, and typically expensive, external test devices can then be used to trim the bandgap device of FIG. 4 to provide an accurate Vbgr value over the temperature range while still meeting the restriction place upon implementations as a peripheral circuit.

During trimming process over temperature, while chip has its ambient temperature changed, the tester or precision measurement equipment are in an environment with relatively constant ambient temperature. This allows the trimming reference voltage to be constant without any temperature effects. This setup allows the trimming reference to have no first, second, or even third order variations while chip is being trimmed at different temperatures, in principle allowing the final trimmed bandgap circuit on the chip to have no first, second, or even third order temperature coefficient.

For a linear implementation, this require two temperature points, here 125C and −30C. At Temp=125C, Vbgr is measured and Ra is tuned to make Vbgr=1.26v (or, more generally, a tester value). The device would then store DAC_RA(125C), DAC_Temp(125C) in a non-volatile memory, such as some sort of ROM fuse or one time programmable memory. Similarly, at Temp=−30C, it would measure Vbgr, tune Ra to make Vbgr=1.26v and store DAC_RA(−30C), DAC_Temp(−30C) in the fuse ROM or look up table. These values will then be used with measured temperature during operation. More general functional forms than the linear version here would need addition points determined to set the coefficients and typically would be more reliant upon the accuracy of the external reference tester at trimming.

To take an example of operation, the on chip thermometer will output DAC_temp(T) for any temperature. For an 8-bit implementation, at trimming, the values for −30C and 125C can be measured and stored in a ROM fuse memory at DAC_Temp(−30C)=00 and DAC_Temp(125C)=FF.

Then, before any read/verify operation, the temperature is sensed and the algorithm automatically calculate Ra offset at current temperature based upon stored information, and current temperatures. By dynamically adjusting Ra, the variable resistance, at the known temperature, the final corrected bandgap reference voltage should be relatively constant over temperature. Here, the value of Ra(T) can be given according to:

$$DAC\_Ra(T) = \frac{DAC\_Ra(125\ C) - DAC\_Ra(-30\ C)}{DAC\_Temp(125\ C) - DAC\_Temp(-30\ C)} * \left[ \begin{array}{c} DAC\_Temp(T) - \\ DAC\_temp(-30\ C) \end{array} \right]$$

The ratio of the DAC_Ra to DAC_Temp values give the slope and the temperature difference is measured with respect to −30C, at which DAC_Ra(T) is taken as 0, although other zero points could be taken.

Although the invention has been described with reference to particular embodiments, the description is only an example of the invention's application and should not be taken as a limitation. Consequently, various adaptations and combinations of features of the embodiments disclosed are within the scope of the invention as encompassed by the following claims.

It is claimed:

1. A circuit to provide a reference voltage, comprising:
   a current source having a magnitude with positive temperature correlation connected between a high voltage level and a node to supply the node;
   a diode element connected between the node and ground; and
   a variable resistance connected to receive an input indicative of the circuit temperature and through which the diode element is connected to the node, wherein the value of the variable resistance is adjusted based upon the circuit temperature input and wherein the reference voltage is provided from the node.

2. The circuit of claim 1, wherein the input indicative of the circuit temperature for the variable resistance is provided as a digital value from a temperature sensor.

3. The circuit of claim 1, wherein the value of the variable resistance corresponding to a given value of the input indicative of the circuit temperature is held in a one time programmable memory.

4. The circuit of claim 3, wherein the one time programmable memory is set by the manufacturer.

5. The circuit of claim 3, wherein the one time programmable memory is set using external test equipment to supply trimming reference values at relatively stable ambient temperature.

6. The circuit of claim 1, wherein the value of the variable resistance varies linearly with the circuit temperature.

7. A circuit, including:
   a temperature sensor; and
   a reference voltage generation circuit, comprising:
      a current source having a magnitude with positive temperature correlation connected between a high voltage level and a node to supply the node;
      a diode element connected between the node and ground; and
      a variable resistance connected to receive an output of the temperature sensor and through which the diode element is connected to the node, wherein the value of the variable resistance is adjusted based upon the circuit temperature input and wherein the reference voltage is provided from the node.

8. The circuit of claim 7, wherein the temperature sensor and the reference voltage generation circuit are peripheral elements on the circuit.

9. The circuit of claim 8, wherein the circuit is a non-volatile memory circuit.

10. The circuit of claim 8, wherein the circuit is a charge pump circuit.

11. The circuit of claim 7, wherein the temperature sensor is a digital thermometer.

12. The circuit of claim 7, wherein the value of the variable resistance corresponding to a given value of the input indicative of the circuit temperature is held in a non-volatile programmable memory.

13. The circuit of claim 12, wherein the one time programmable memory is set by the manufacturer.

14. The circuit of claim 12, wherein the non-volatile programmable memory is set using external test equipment to supply trimming reference values.

15. The circuit of claim 7, wherein the value of the variable resistance varies linearly with the circuit temperature.

* * * * *